United States Patent [19]

Hidaka

[11] Patent Number: 5,036,485
[45] Date of Patent: Jul. 30, 1991

[54] BLOCH-LINE MEMORY DEVICE CAPABLE OF STABLY GENERATING A MAGNETIC DOMAIN

[75] Inventor: Yasuharu Hidaka, Tokyo, Japan
[73] Assignee: NEC Corporation, Tokyo, Japan
[21] Appl. No.: 533,511
[22] Filed: Jun. 5, 1990
[30] Foreign Application Priority Data
Jun. 6, 1989 [JP] Japan ................. 1-144896
[51] Int. Cl.$^5$ ............................................. G11C 19/08
[52] U.S. Cl. .............................................. 365/29; 365/15
[58] Field of Search ........................ 365/29, 37, 87, 15
[56] References Cited

U.S. PATENT DOCUMENTS 4,583,200  4/1986  Konishi et al. ................ 365/29
4,731,752  3/1988  Hidaka ............................ 365/29

FOREIGN PATENT DOCUMENTS 0255894  10/1988  Japan .............................. 365/29

Primary Examiner—Joseph A. Popek
Attorney, Agent, or Firm—Burns, Doane, Swecker & Mathis

[57] ABSTRACT

In a magnetic medium used in a Bloch-line memory device and having a first groove and a pair of second grooves deeper than the first groove with the first groove formed to leave a plateau extended on a principal surface in a predetermined direction between the second groove pair and having first and second end portions, a third groove is deeper than the first groove and has two portions spaced from the second end portion parallel and orthogonal to the predetermined direction. Adjacent to the second end portion, a primary conductor pair is formed on the first groove and adjacent to the second and the third grooves. Parallel to an easy axis of magnetization which is orthogonal to the principal surface, a magnetic domain is formed to surround the plateau by a bias magnetic field applied in a preselected direction parallel to the easy axis. A pulse current is supplied to the primary conductors to generate, with a field intensity not stronger than the bias magnetic field, a first local magnetic field between the primary conductor pair substantially reversedly of the preselected direction and a second local magnetic field directed in the preselected direction at the second and the third grooves. A secondary conductor of a W shape may be formed on the first groove and adjacent to the first end portion and to the second groove with the W shape directed away from the plateau.

4 Claims, 3 Drawing Sheets

BLOCH-LINE MEMORY DEVICE CAPABLE OF STABLY GENERATING A MAGNETIC DOMAIN

BACKGROUND OF THE INVENTION

This invention relates to a Bloch-line memory device for memorizing information as a pair of Bloch lines in a magnetic medium.

A conventional Bloch-line memory device comprises a magnetic medium having a principal surface and an easy axis of magnetization that is orthogonal to the principal surface. The magnetic medium comprises at least one magnetic domain of an elongated ring shape that is defined between inner and outer domain walls orthogonal to the principal surface. The outer domain wall is for memorizing an information signal as a pair of Bloch lines which are orthogonal to the principal surface. Such a Bloch-line memory device is disclosed, for example, in U.S. Pat. No. 4,583,200 issued to Susumu Konishi and the present applicant.

Another conventional Bloch-line memory device is disclosed, for example, in U.S. Pat. No. 4,731,752 issued to Yasuharu Hidaka, the present applicant. In the Hidaka Bloch-line memory device, the magnetic medium has a first groove or stepped portion which has a first groove or step depth from the principal surface to a bottom surface of the first groove to leave a portion of the principal surface as a plateau with the plateau extended in a predetermined direction. The plateau has first and second plateau end portions spaced apart in the predetermined direction and a plateau intermediate portion between the first and the second plateau end portions.

A magnetic domain generator controllably generates the magnetic domain between the inner and the outer domain walls. The inner domain wall surrounds the plateau and is extended from the bottom surface of the first groove orthogonally of the principal surface into the magnetic medium. On generating the magnetic domain by using the magnetic domain generator, presence of the first groove enables the inner domain wall to locate near to the plateau. This renders the magnetic domain stably. In other words, the inner domain wall exactly surrounds the plateau.

In Japanese Unexamined Patent Prepublication or Kokai No. Syo 63-255,894, namely, 255,894/1988, a different Bloch-line memory device is disclosed by the present applicant and three others. As will later be described in conjunction with one figure of the accompanying drawing, the magnetic medium further has a pair of second grooves and a third groove. The second grooves are extended in the predetermined direction on both sides of the plateau and share a second depth which is deeper than the first depth. The third groove has the second depth and is contiguous to the second grooves. The third groove comprises first and second groove portions which are parallel to and orthogonal to the predetermined direction. The second plateau end portion is nearer to the third groove than the first plateau end portion.

The magnetic domain generator generates the magnetic domain having the inner and the outer domain wall. The inner domain wall surrounds the plateau like in the Hidaka Bloch-line memory device. The outer domain wall surrounds the plateau and is extended from the bottom surface of the first groove orthogonally of the principal surface into the magnetic medium. Presence of the second grooves enables the outer domain wall to locate near to the plateau on making the magnetic domain generator generate the magnetic domain.

The Hidaka et al Bloch-line memory device is, however, defective in that the magnetic domain can not stably have a portion of the elongated ring shape near the second plateau end portion under the influence of the second groove for the reason which will later be described.

Summary of the Invention

It is therefore an object of this invention to provide a Bloch-line memory device which is capable of stably generating a magnetic domain of an elongated ring shape.

Other objects of this invention will become clear as the description proceeds.

On describing the gist of this invention, it is possible to understand that a Bloch-line memory device comprises: a magnetic medium having a principal surface, an easy axis of magnetization orthogonal to the principal surface, a first groove having a first depth from the principal surface to a bottom surface of the first groove to leave a portion of the principal surface as a plateau with the plateau extended in a predetermined direction, a pair of second grooves extended in the predetermined direction on both sides of the plateau and sharing a second depth which is deeper than the first depth, and a third groove having the second depth and comprising first and second groove portions which are parallel to and orthogonal to the predetermined direction, the plateau having first and second plateau end portions spaced apart in the predetermined direction and a plateau intermediate portion between the first and the second plateau end portions, the second plateau end portion being nearer to the third groove than the first plateau end portion; and magnetic domain generating means for controllably generating a magnetic domain defined between an inner and an outer domain wall. The inner domain wall surrounds the plateau and is extended from the bottom surface of the first groove orthogonally of the principal surface into the magnetic medium. The outer domain wall is extended from the bottom surface of the first groove orthogonally of the principal surface into the magnetic medium. The outer domain wall serves to memorize an information signal as a pair of Bloch lines.

According to this invention, the third groove of the above-understood Bloch-line memory device is spaced apart from the second grooves so that the first groove portion is between the second grooves and does not reach the second plateau end portion. The magnetic domain generating means comprises: bias magnetic field generating means for generating a bias magnetic field of a bias intensity in the magnetic medium substantially in a preselected direction which is perpendicular to the principal surface and is directed in a preselected one of a forward sense of from the bottom surface towards the principal surface and a reversed sense which is antiparallel to the forward sense; and a pair of primary conductors on the bottom surface of the first groove and adjacent to the second plateau end portion and to the second and the third grooves. The primary conductors are supplied with a primary electric pulse current for generating a first local magnetic field between the primary conductors substantially in a reversed direction relative to the preselected direction and a second local magnetic field substantially in the preselected direction on bottom surfaces of the second and the third grooves. Each of the first and the second local magnetic fields has a local intensity which is not stronger than the bias intensity.

DESCRIPTION OF THE PREFERRED EMBODIMENTS

Figure 1:
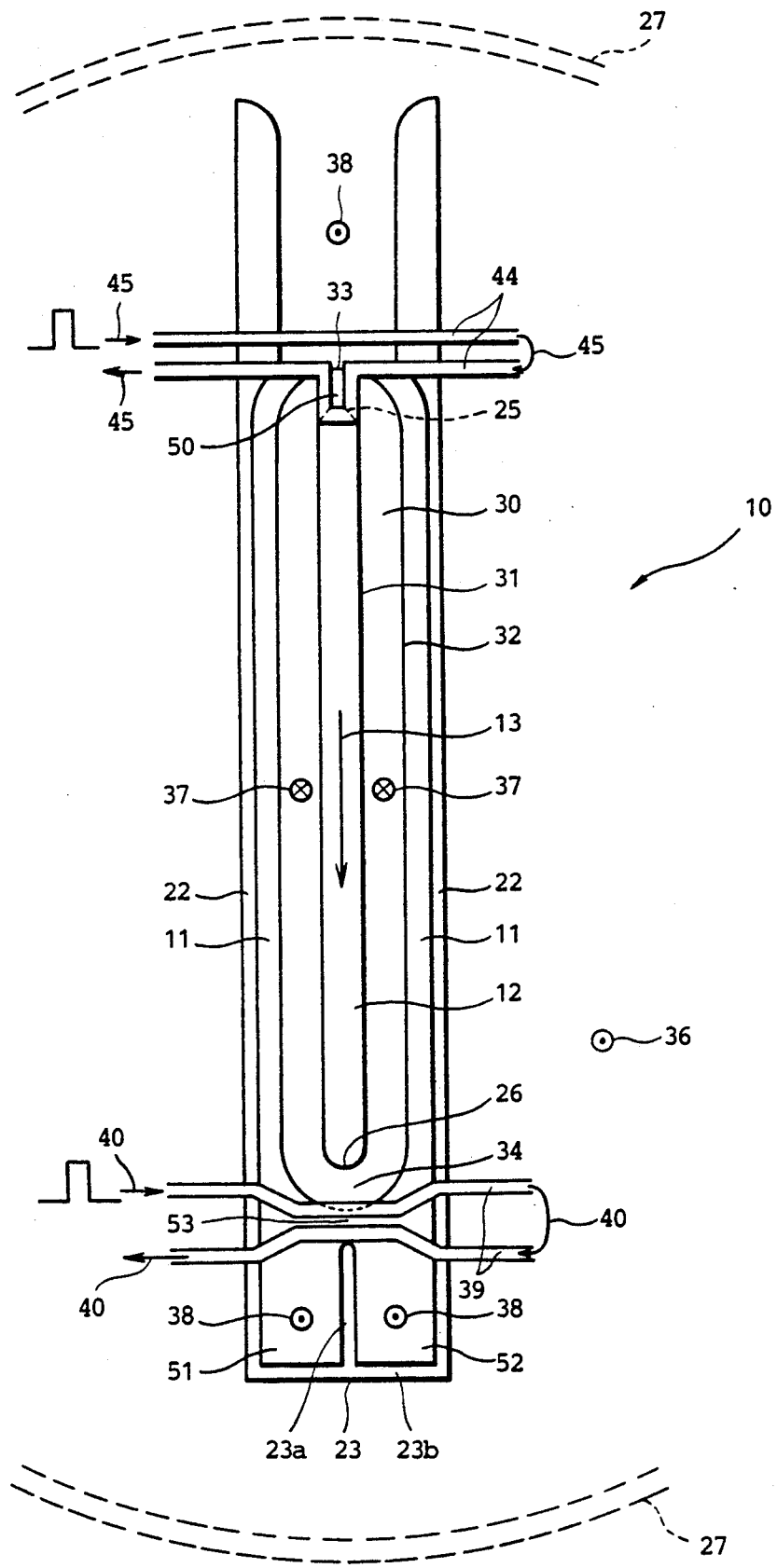
FIG. 1 is a plan view of a conventional Bloch-line memory device.

Referring to FIG. 1, a conventional Bloch-line memory device will be described at first for a better understanding of this invention. The conventional Bloch-line memory device is equivalent to the Hidaka et al Bloch-line memory device described heretobefore.

The conventional Bloch-line memory device comprises a magnetic medium 10, such as a garnet sheet. The magnetic medium 10 has a principal surface and an easy axis of magnetization that is orthogonal to the principal surface.

A first groove or stepped portion 11 is formed in the magnetic medium 10 to have a first groove or step depth from the principal surface to a bottom surface of the first groove 11 and to leave a portion of the principal surface as a plateau 12 with the plateau 12 extended in a predetermined direction which is depicted by an arrow 13 inside the plateau 12. A pair of second grooves 22 are extended in the predetermined direction 13 on both sides of the plateau 12 to share a second depth which is deeper than the first depth. A third groove 23 has also the second depth and is contiguous to the second grooves 22. The third groove 23 comprises first and second groove portions 23a and 23b which are parallel to and orthogonal to the predetermined direction 13.

The plateau 12 has first and second plateau end portions 25 and 26 spaced apart in the predetermined direction 13 and a plateau intermediate portion between the first and the second plateau end portions 25 and 26. The second plateau end portion 26 is nearer to the third groove 23 than the first plateau end portion 25.

As will later be described, a magnetic domain generator controllably generates a magnetic domain 30 of an elongated ring shape that is defined between inner and outer domain walls 31 and 32. The inner domain wall 31 surrounds or outlines the plateau 12 and is extended from the bottom surface of the first groove 11 orthogonally of the principal surface into the magnetic medium 10. The outer domain wall 32 is extended from the bottom surface of the first groove 11 orthogonally of the principal surface into the magnetic medium 10. The outer domain wall 32 is spaced apart from the second and the third grooves 22 and 23. On generating the magnetic domain 30 by using the magnetic domain generator, presence of the first groove 11 enables the inner domain wall 31 to locate near to the plateau 12. Presence of the second groove 22 enables the outer domain wall 32 to locate near to the plateau 12. The outer domain wall 32 serves to memorize an information signal as a pair of vertical Bloch lines.

The magnetic domain 30 has first and second domain end portions 33 and 34 spaced apart in the predetermined direction 13 and a domain intermediate portion between the domain end portions 33 and 34. The second domain end portion 34 is nearer to the third groove 23 than the first domain end portion 33.

A coil 27 serves as a bias magnetic field generator which generates a domain maintaining bias magnetic field in the magnetic medium 10 in a preselected direction 36 perpendicularly of the principal surface. In the example being illustrated, the preselected direction 36 has a first sense which is directed from the bottom surface of the first groove 11 towards the principal surface. Alternatively, the preselected direction 36 may have a second sense which is directed from the principal surface towards the bottom surface. Merely for convenience of the description, the first and the second senses are herein called a forward and a reversed sense.

When the domain maintaining bias magnetic field is directed to the preselected direction 36 being illustrated, magnetization is directed within the magnetic domain 30 in the reversed sense indicated by an encircled crisscross 37. Outwardly of the magnetic domain 30, the magnetization is directed in the forward sense indicated by an encircled dot 38.

Writing/reading operation of the Bloch-lines in/from the outer domain wall 32 is carried out in the manner known in the art. Such writing/reading operation is disclosed in U.S. Pat. Nos. 4,583,200 and 4,731,752 which are referred to hereinabove.

Description will proceed to the magnetic domain generator. On generating the magnetic domain 30 by using the magnetic domain generator, the coil 27 serves to generate a domain generating bias magnetic field in the magnetic medium 10 substantially in the preselected direction 36. The magnetic domain generator comprises a pair of primary conductors 39 adjacent to the second plateau end portion 26 on the bottom surface of the first groove 11 and stepped portions on the second grooves 22. As will presently be described, the primary conductors 39 are supplied with a primary electric pulse current 40. A pair of secondary conductors 41 is formed adjacent to the first plateau end portion 25 on the bottom surface of the first groove 11 to have stepped portions in the second grooves 22. As will also presently be described, the secondary conductors 44 are supplied with a secondary electric pulse current 45.

Description will proceed to a magnetic domain generating operation of the magnetic domain generator. A strong magnetic field is preliminarily applied substantially in the preselected direction 36 to the magnetic medium 10 by the use of the coil 27 to clear a magnetic domain which may be previously generated in the magnetic medium 10. Thereafter, the domain generating bias magnetic field is applied substantially in the preselected direction 36 to the magnetic medium 10 by the use of the coil 27. The domain generating bias magnetic field has a bias intensity which is slightly less than that of the strong magnetic field. When the secondary electric pulse current 45 is supplied to the secondary conductors 44, a magnetic bubble domain of a circular shape is generated in a first location 50 of the first groove 11 that is adjacent to the first plateau end portion 25.

Thus, the secondary conductors 44 generates the first domain end portion 33 when the secondary conductors 44 are supplied with the secondary electric pulse current 45 with the domain generating bias magnetic field generated by the coil 27.

Thereafter, the magnetic bubble domain is extended or expanded towards two groove end portions 51 and 52 in the first groove 11 on both sides of the plateau 12 so that the magnetic bubble domain is changed into a U-shaped domain having two extended ends located in the groove end portions 51 and 52.

Subsequently, the primary conductors 39 are supplied with the primary electric pulse current 40 to connect the extended end of the U-shaped domain to each other in a second location 53 of the first groove 11 that is adjacent to the second plateau end portion 25 between the primary conductors 39. As a result, the U-shaped domain is changed into the magnetic domain 30 of an elongated ring or arcuate shape.

Thus, the primary conductors 39 generates the second domain end portion 34 when the primary conductors 39 are supplied with the primary electric pulse current 40 with the domain generating bias magnetic field generated by the coil 27.

However, the outer domain wall 32 of the U-shaped domain unavoidably falls in the second groove 22 near the primary conductors 39 under the influence of a local magnetic field which is generated around the primary conductors 39 when the primary conductors 39 are supplied with the primary electric pulse current 40. Once the outer domain wall 32 falls in the second groove 22, it is impossible to restore the outer wall 32 in the first groove 11. Thus, the magnetic domain 30 can not stably have a portion of the elongated ring shape near the second plateau end portion 26 as described in the preamble of the instant specification.

Inasmuch as an inner one of the secondary conductors 44 is of a shape which has only one notch or bend at the first location 50, the magnetic bubble domain is inevitably generated in the first location 50 to have a circular shape. The magnetic bubble domain of the circular shape may often be extended only towards either one of the groove end portions 51 and 52. In this case, it is therefore impossible to form the magnetic domain 30 of the elongated ring shape.

Figure 2:
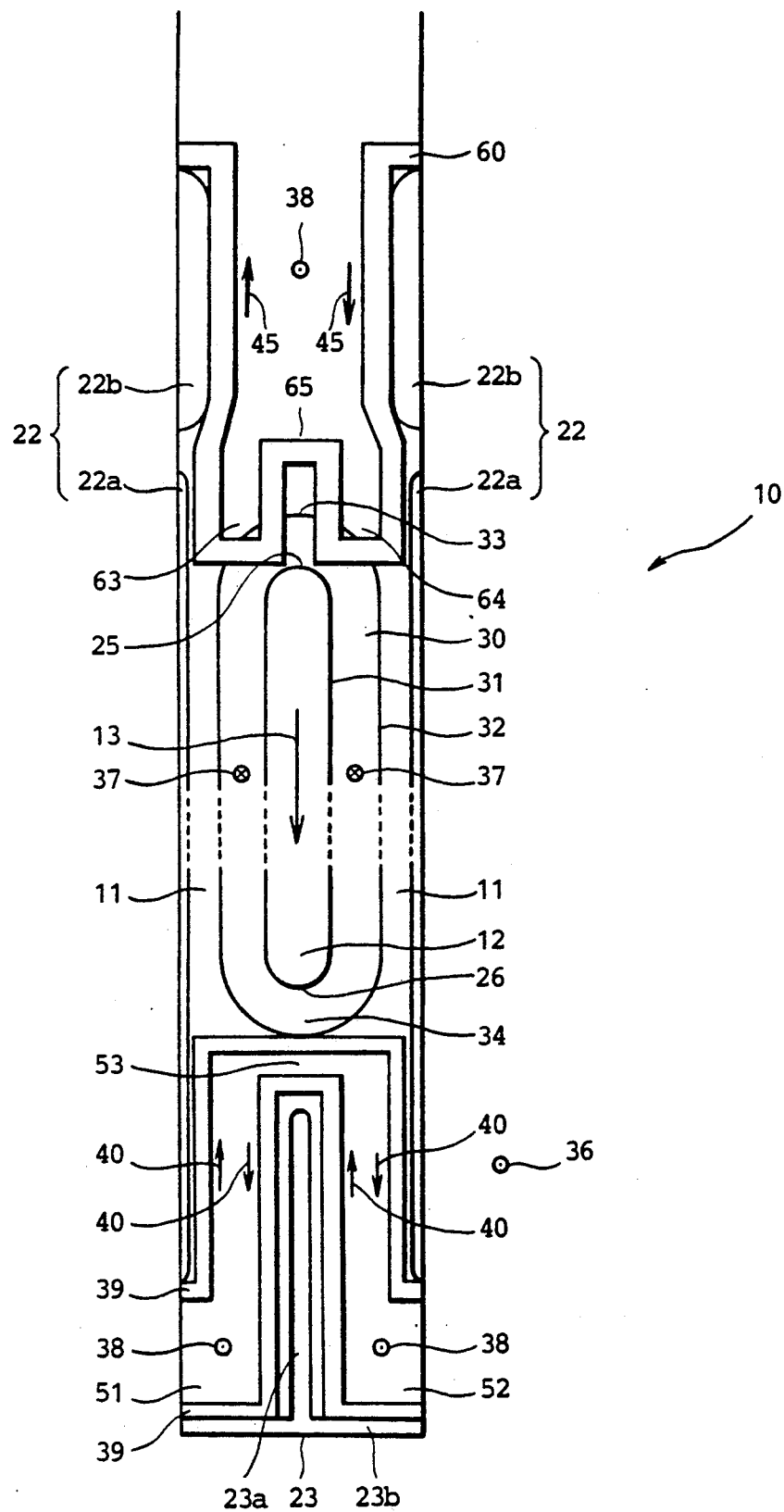
FIG. 2 is a plan view of a Bloch-line memory device according to a first embodiment of this invention.

Turning to FIG. 2, a Bloch-line memory device according to a first embodiment of this invention comprises similar parts designated by like reference numerals. In the illustrated Bloch-line memory device, a pair of the second grooves 22 is divided into a pair of primary grooves 22a and another pair of secondary grooves 22b so that the secondary grooves 22b are spaced apart from the primary grooves 22a. The primary and the secondary grooves 22a and 22b have the second depth in common. However, the secondary grooves 22b are not necessarily spaced apart from the primary grooves 22a. That is, the primary grooves 22a may be kept contiguous to the secondary grooves 22b like in the Bloch-line memory device illustrated in FIG. 1. The primary and the secondary grooves 22a and 22b are therefore referred to herein as the second grooves 22.

In the Bloch-line memory device, the third groove 23 is spaced apart from the second grooves 22 so that the first groove portion 23a is between the pair of second grooves 22 and does not reach the second plateau end portion 26.

The magnetic domain generator of the Bloch-line memory device comprises a coil which is similar in structure and in operation to the coil 27 in the conventional Bloch-line memory device illustrated in FIG. 1 and is not depicted in FIG. 2 merely for simplicity of illustration. The coil serves as a bias magnetic field generator for generating the domain generating bias magnetic field of a bias intensity in the magnetic medium 10 substantially in the preselected direction 36.

The magnetic domain generator further comprises a pair of primary conductors 39 and a secondary conductor 60. The primary conductors 39 is for generating the second domain end portion 34 when the primary conductors 39 are supplied with the primary electric pulse current 40 with the domain generating bias magnetic field generated by the bias magnetic field generator. The secondary conductor 60 is for generating the first domain end portion 33 when the secondary conductor 60 is supplied with the secondary electric pulse current 45 with the domain generating bias magnetic field generated by the bias magnetic field generator.

Attention will be directed to the primary conductors 39. The primary conductors 39 are formed on the bottom surface of the first groove 11 and adjacent to the second plateau end portion 26 and to the second and the third grooves 22. Supplied with the primary electric pulse current 40, the primary conductors 39 generate a first local magnetic field between the primary conductors 39 substantially in a reversed direction relative to the preselected direction 36 and a second local magnetic field substantially in the preselected direction 36 on bottom surfaces of the second and the third grooves 22 and 23. Each of the first and the second local magnetic fields has a primary local intensity which is equal to or weaker than the bias intensity.

As mentioned above, the primary conductors 39 are supplied with the primary electric pulse current 40 with the domain generating bias magnetic field generated by the bias magnetic field generator. As a result, a first resultant magnetic field of a first resultant intensity is applied substantially in the preselected direction 36 to that bottom surface portion of the first groove 11 which is present between the primary conductors 39. The first resultant intensity is substantially equal to a difference which is given by subtracting the primary local intensity from the bias intensity.

A second resultant magnetic field of a second resultant intensity is applied substantially in the preselected direction 36 onto those bottom surface portions of the second and the third grooves 22 and 23 which are adjacent to the primary conductors 39. The second resultant intensity is substantially equal to a sum of the bias intensity and the primary local intensity.

Inasmuch as the first resultant intensity is weaker than the second resultant intensity, the outer domain wall 32 of the U-shaped domain never falls in the second groove 22 near the primary conductors 39 even when the primary conductors 39 are supplied with the primary electric pulse current 40 in order to generate the magnetic domain 30.

Attention will be directed to the secondary conductor 60. The secondary conductor 60 is of a W shape and is formed on the bottom surface of the first groove 11 and adjacent to the first plateau end portion 25 and to the second grooves 22b. The W shape has a top of the shape remoter from the plateau 12 and a bottom nearer to the plateau 12. That is, the W shape has a top directed away from the plateau 12.

Supplied with the secondary electric pulse current 45, the secondary conductor 60 generates a third local magnetic field substantially in the reversed direction in an outward area of the bottom surface of the first groove 11 and a fourth local magnetic field substantially in the preselected direction in an inward area of the bottom surface of the first groove 11 and in bottom surfaces of the second grooves 22b. The outward area is outwardly of the secondary conductor 60 relative to the first plateau end portion 25 while the inward area is inwardly of the secondary conductor 60 relative to the first plateau end portion 25. Each of the third and the fourth local magnetic fields has a secondary local intensity which is stronger than the bias intensity.

The secondary conductor 60 is supplied with the secondary electric pulse current 45 with the domain generating bias magnetic field generated by the bias magnetic field generator. As a result, a third resultant magnetic field of a third resultant intensity is applied substantially in the reversed direction onto the outward area of the bottom surface of the first groove 11. The third intensity is substantially equal to another difference which is given by subtracting the bias intensity from the secondary local intensity.

A fourth resultant magnetic field of a fourth resultant intensity is applied substantially in the preselected direction 36 to the inward area of the bottom surface of the first groove 11 and to the bottom surfaces of the second grooves 22b. The fourth resultant intensity is substantially equal to another sum of the bias intensity and the secondary local intensity.

The secondary conductor 60 of the W shape has two notches or bends at third and fourth locations 63 and 64 of the outward area of the bottom surface of the first groove 11.

When the secondary electric pulse current 45 is supplied to the secondary conductor 60 with the domain generating bias magnetic field applied substantially in the preselected direction 36 to the magnetic medium 10 like in the Bloch-line memory device illustrated in FIG. 1, a magnetic bubble domain is generated to have a U shape having two top end parts and a bottom or arcuate end part with the top end parts located in the third and the fourth locations 63 and 64 and with the bottom end part located in a fifth location 65 of the outward area of the bottom surface of the first groove 11.

Inasmuch as the magnetic bubble domain is generated to have the U shape rather than the circular shape, the magnetic bubble domain can accurately and reliably be extended or expanded towards the groove end portions 51 and 52 in the first groove 11 on both sides of the plateau 12 so that the magnetic bubble domain is changed into a U-shaped domain having two extended ends located in the groove end portions 51 and 52. Therefore, it is possible to reliably form the magnetic domain 30 of the elongated ring shape by supplying the primary electric pulse current 40 to the primary conductors 39 so that the extended ends of the U-shaped domain are connected to each other in the second location 53.

Figure 3:
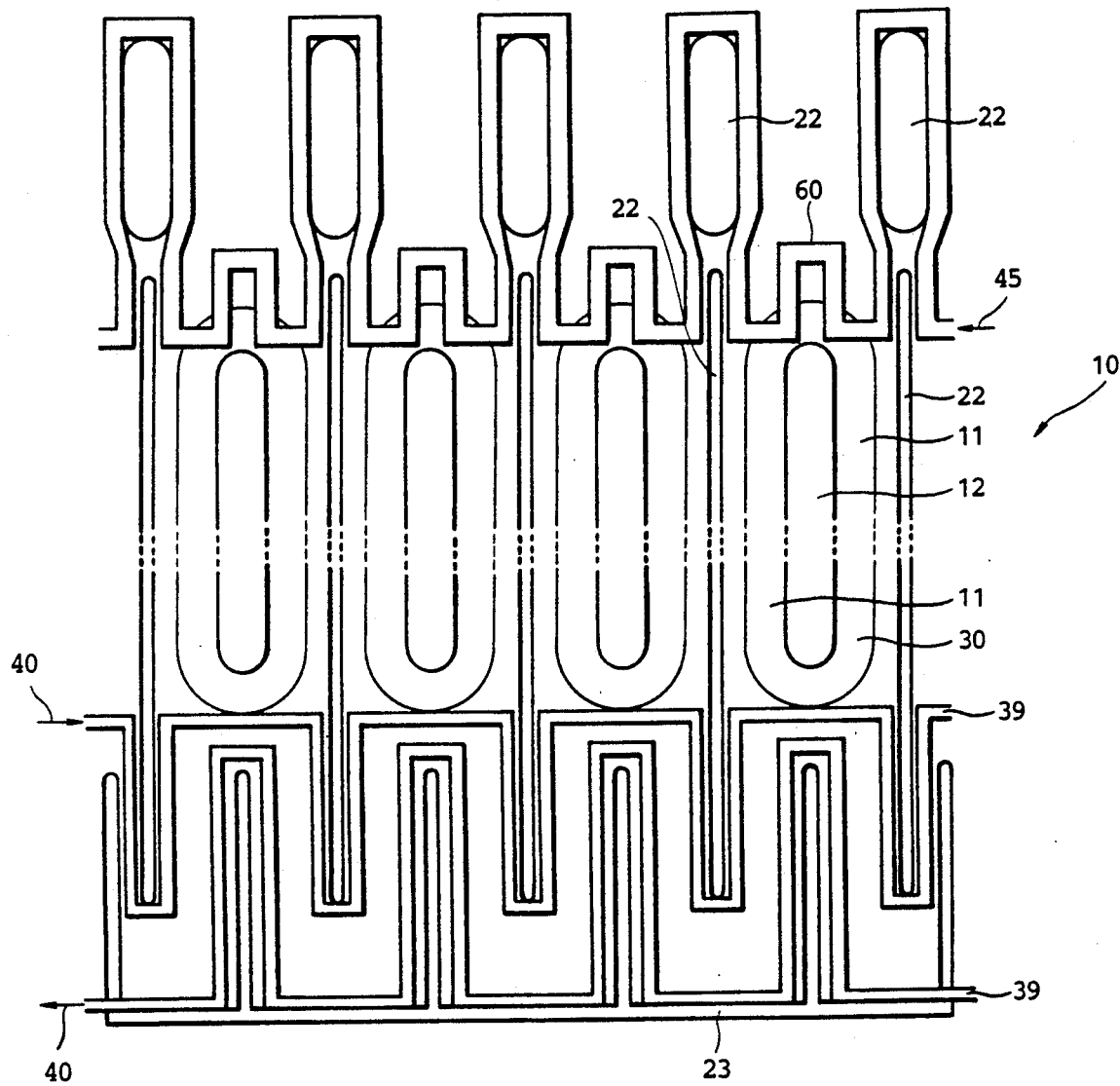
FIG. 3 is a plan view of a Bloch-line memory device according to a second embodiment of this invention.

Turning to FIG. 3, a Bloch-line memory device according to a second embodiment of this invention comprises similar parts designated by like reference numerals. In the Bloch-line memory device, the magnetic medium 10 comprises a plurality of the plateaux 12. A plurality of the magnetic domains 30 are generated in the magnetic medium 10 so that each of the magnetic domains 30 surrounds each of the plateaux 12.

What is claimed is:

1. A Bloch-line memory device comprising:
    a magnetic medium having a principal surface, an easy axis of magnetization orthogonal to said principal surface, a first groove having a first depth from said principal surface to a bottom surface of said first groove to leave a portion of said principal surface as a plateau with said plateau extended in a predetermined direction, a pair of second grooves extended in said predetermined direction on both sides of said plateau and sharing a second depth which is deeper than said first depth, and a third groove having said second depth and comprising first and second groove portions which are parallel to and orthogonal to said predetermined direction, said plateau having first and second plateau end portions spaced apart in said predetermined direction and a plateau intermediate portion between said first and said second plateau end portions, said second plateau end portion being nearer to said third groove than said first plateau end portion; and magnetic domain generating means for controllably generating a magnetic domain defined between an inner and an outer domain wall, said inner domain wall surrounding said plateau and extended from the bottom surface of said first groove orthogonally of said principal surface into said magnetic medium, said outer domain wall being extended from the bottom surface of said first groove orthogonally of said principal surface into said magnetic medium, said outer domain wall serving to memorize an information signal as a pair of Bloch lines;

said third groove being spaced apart from said second grooves so that said first groove portion is between said second grooves and does not reach said second plateau end portion;

said magnetic domain generating means comprising:
    bias magnetic field generating means for generating a bias magnetic field of a bias intensity in said magnetic medium substantially in a preselected direction which is perpendicular to said principal surface and is directed in a preselected one of a forward sense of from said bottom surface towards said principal surface and a reversed sense which is antiparallel to said forward sense; and a pair of primary conductors on the bottom surface of said first groove and adjacent to said second plateau end portion and to said second and the third grooves, said primary conductors being supplied with a primary electric pulse current for generating a first local magnetic field between said primary conductors substantially in a reversed direction relative to said preselected direction and a second local magnetic field substantially in said preselected direction on bottom surfaces of said second and said third grooves, each of said first and said second local magnetic fields having a local intensity which is not stronger than said bias intensity.

2. A Bloch-line memory device as claimed in claim 1, said magnetic domain having first and second domain end portions spaced apart in said predetermined direction and a domain intermediate portion between said first and said second domain end portions, said second domain end portion being nearer to said third groove than said first domain end portion, wherein said primary conductors are for generating said second domain end portion when supplied with said primary electric pulse current with said bias magnetic field generated by said bias magnetic field generating means.

3. A Bloch-line memory device as claimed in claim 1, wherein said magnetic domain generating means further comprises:
    a secondary conductor of a W shape on the bottom surface of said first groove and adjacent to said first plateau end portion and to said second grooves, said W shape having a top and a bottom remoter from and nearer to said plateau, said secondary conductor being supplied with a secondary electric pulse current for generating a third local magnetic field substantially in said reversed direction in an outward area of the bottom surface of said first groove and a fourth local magnetic field substantially in said preselected direction in an inward area of the bottom surface of said first groove and in bottom surfaces of said second grooves, said outward area being outwardly of said secondary conductor relative to said first plateau end portion, said inward area being inwardly of said secondary conductor relative to said first plateau end portion, each of said third and said fourth local magnetic fields having another local intensity which is stronger than said bias intensity.

4. A Bloch-line memory device as claimed in claim 3, said magnetic domain having first and second domain end portions spaced apart in said predetermined direction and a domain intermediate portion between said first and said second domain end portions, said second domain end portion being nearer to said third groove than said first domain end portion, wherein said secondary conductor is for generating said first domain end portion when supplied with said secondary electric pulse current with said bias magnetic field generated by said bias magnetic field generating means.

* * * * *